(12) United States Patent
Chen

(10) Patent No.: US 10,530,328 B2
(45) Date of Patent: Jan. 7, 2020

(54) SURFACE ACOUSTIC WAVE DEVICE

(71) Applicant: Zhuohui Chen, Ottawa (CA)

(72) Inventor: Zhuohui Chen, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 174 days.

(21) Appl. No.: 15/713,117

(22) Filed: Sep. 22, 2017

(65) Prior Publication Data

US 2019/0097601 A1    Mar. 28, 2019

(51) Int. Cl.
  *H03H 9/02* (2006.01)
  *H03H 9/64* (2006.01)
  *H03H 9/145* (2006.01)

(52) U.S. Cl.
  CPC .... *H03H 9/02574* (2013.01); *H03H 9/02834* (2013.01); *H03H 9/145* (2013.01); *H03H 9/14538* (2013.01); *H03H 9/14541* (2013.01); *H03H 9/64* (2013.01)

(58) Field of Classification Search
  CPC ........... H03H 9/02574; H03H 9/02582; H03H 9/02834; H03H 9/02889; H03H 9/145; H03H 9/14541; H03H 9/25; H03H 9/64; H01L 41/081
  USPC ....................................... 333/193; 310/313 B
  See application file for complete search history.

(56) References Cited

U.S. PATENT DOCUMENTS

| | | | |
|---|---|---|---|
| 4,952,832 A * | 8/1990 | Imai | H03H 9/02582 310/313 A |
| 5,274,345 A | 12/1993 | Gau | |
| 5,446,329 A * | 8/1995 | Nakahata | H03H 9/02582 310/313 A |
| 5,565,724 A | 10/1996 | Hachigo et al. | |
| 5,576,589 A * | 11/1996 | Dreifus | H03H 9/02582 310/313 A |
| 8,165,682 B2 | 4/2012 | Gopalsami et al. | |
| 8,378,553 B1 | 2/2013 | Naumenko et al. | |
| 9,425,765 B2 * | 8/2016 | Rinaldi | G01J 5/046 |
| 2003/0001696 A1 | 1/2003 | Yoshida et al. | |
| 2003/0030119 A1 | 2/2003 | Higgins, Jr. et al. | |
| 2010/0021708 A1* | 1/2010 | Kong | B82Y 30/00 428/220 |
| 2011/0163298 A1* | 7/2011 | Sung | G03H 1/02 257/29 |
| 2012/0228993 A1* | 9/2012 | Colli | H01L 41/0478 310/313 R |
| 2013/0342079 A1 | 12/2013 | Schmidhammer et al. | |
| 2015/0123746 A1 | 5/2015 | Nakamura et al. | |

(Continued)

FOREIGN PATENT DOCUMENTS

| CN | 1645744 A | 7/2005 |
|---|---|---|
| CN | 104810470 A | 7/2015 |

(Continued)

OTHER PUBLICATIONS

"Aluminum Nitride Thin Film Acoustic Wave Device for Microfluidic and Biosensing Applications" by Fu et al. Acoustic Waves Book edited by Don W. Dissanayake. ISBN 978-953-307-111-4, pp. 466. Sep. 2010.

(Continued)

*Primary Examiner* — Barbara Summons

(57) ABSTRACT

A surface acoustic wave (SAW) device including a piezoelectric layer, a high acoustic velocity layer coupled to the piezoelectric layer, and at least one transducer. The SAW device may include a multi-layer graphene layer in the electrodes of the transducer and/or in a conductive layer that is coupled to the piezoelectric layer.

18 Claims, 13 Drawing Sheets

(56) References Cited

U.S. PATENT DOCUMENTS

2017/0309362 A1* 10/2017 Liu .................. C01B 32/15
2019/0035907 A1* 1/2019 Boutchich ......... H01L 29/42364

FOREIGN PATENT DOCUMENTS

EP          1926211 A2       5/2008
EP        3 206 232 A1  *    8/2017

OTHER PUBLICATIONS

"High Q surface acoustic wave resonators in 2-3 GHz range using ScAlN-single crystalline diamond structure" by Hashimoto et al. (Conf.: Ultrasonics Symposium (IUS), 2012 IEEE International).
"Surface acoustic wave propagation characteristics of ScAlN/diamond structure with buried electrode" by Zhang et al. (Piezoelectricity Acoustic Waves and Device Applications (SPAWDA) 2014 Symposium on, pp. 271-274, 2014).
"SAW Characteristics of AlN Films Sputtered on Silicon Substrates" Clement, M. et al. Ultrasonics 42 (2004) 403-407.
"Piezoelectric thin AlN films for bulk acoustic wave (BAW) resonators" by Loebl, H.P. et al. Materials Chemistry and Physics 79 (2003) 143-146.
"SAW Impedance Element Filters for 5 GHz and beyond" by Lehtonen, S. et al. 1999 IEEE Ultrasonics Symposium, pp. 395-399.
"High-Performance Surface Acoustic Wave Resonators in the 1 to 3 GHz Range Using a ScAlN/6H-SiC Structure" by Hashimoto, K. et al. IEEE Trans. on Ultrasonics, Ferroelectrics and Frequency Control, vol. 60, No. 3, Mar. 2013.
"SAW Propagation Characteristics and Fabrication Technology Piezoelectric Thin Film / Diamond Structure" by Yamanouchi, K. et al. IEEE 1989 Ultrasonics Symposium. pp. 351-354.
U.S. Appl. No. 15/419,535, "Surface Acoustic Wave Device", filed Jan. 30, 2017.
U.S. Appl. No. 15/361,054, "Surface Acoustic Wave Device", filed Nov. 24, 2016.

* cited by examiner

SURFACE ACOUSTIC WAVE DEVICE

FIELD

The disclosure relates to surface acoustic wave (SAW) devices. In various examples, the disclosure relates to SAW filters, resonators, and/or duplexers with improved electromechanical coupling and higher power durability.

BACKGROUND

In communication systems (both terminal and base station infrastructure), surface acoustic wave (SAW) filters and resonators are widely used. For the next generation wireless communication of 5G new radio (NR), there is growing demand for higher operating frequency, lower Insertion loss, higher transmitting power, and/or wider channel bandwidth. New piezoelectric materials or structures are desirable to support the growing demand for higher frequency and wider channel bandwidth. A high electromechanical coupling coefficient for SAW filters is typically desirable. As the transmitting power increases, the durability of the SAW device deteriorates. Therefore, it may be useful to increase the durability for a higher operating frequency and higher transmitting power.

Scandium-doped aluminum nitride (ScAlN) films have been attempted due to their high piezoelectricity, high thermal conductivity, and relatively high acoustic wave velocity. One such structure is described in "High Q surface acoustic wave resonators in 2-3 GHz range using ScAlN-single crystalline diamond structure" by Hashimoto et al. (Conf.: Ultrasonics Symposium (IUS), 2012 IEEE International), herein expressly incorporated by reference in its entirety.

Similarly, another such structure is described in "Surface acoustic wave propagation characteristics of ScAlN/diamond structure with buried electrode" by Zhang et al. (Piezoelectricity Acoustic Waves and Device Applications (SPAWDA) 2014 Symposium on, pp. 271-274, 2014), herein expressly incorporated by reference in its entirety.

These structures have been explored but have not been adequate to address the specific challenges as described herein.

SUMMARY

In various examples described herein, the incorporation of a multi-layer graphene layer in a SAW device results in high effective electromechanical coupling coefficient, high operating frequency and high power durability.

In some aspects, the present disclosure describes a surface acoustic wave (SAW) device. The SAW device includes a piezoelectric layer, a high acoustic velocity layer coupled to the piezoelectric layer at a first surface of the piezoelectric layer, and at least one transducer between the piezoelectric layer and the high acoustic velocity layer. The at least one transducer includes a first multi-layer graphene layer. The at least one transducer is configured to propagate a surface acoustic wave having an operating wavelength ($\lambda$) along the piezoelectric layer.

In any of the preceding aspects/embodiments, the first multi-layer graphene layer may include 2-10 atomic layers of graphene.

In any of the preceding aspects/embodiments, the first multi-layer graphene layer may include 3-5 atomic layers of graphene.

In any of the preceding aspects/embodiments, the SAW may include a conductive layer coupled to a second surface of the piezoelectric layer, opposing the first surface of the piezoelectric layer.

In any of the preceding aspects/embodiments, the conductive layer may be a second multi-layer graphene layer coupled to a metal layer.

In any of the preceding aspects/embodiments, the second multi-layer graphene layer may be 3-10 atomic layers of graphene.

In any of the preceding aspects/embodiments, the conductive layer may be a second multi-layer graphene layer.

In any of the preceding aspects/embodiments, the second multi-layer graphene layer may be 3-10 atomic layers of graphene.

In any of the preceding aspects/embodiments, the transducer may include the first multi-layer graphene layer coupled to a metal layer.

In any of the preceding aspects/embodiments, the first multi-layer graphene layer may be 3-10 atomic layers of graphene.

In any of the preceding aspects/embodiments, the at least one transducer may be embedded in the piezoelectric layer.

In any of the preceding aspects/embodiments, the at least one transducer may be embedded in the high acoustic velocity layer.

In some aspects, the present disclosure describes a surface acoustic wave (SAW) device. The SAW device includes a piezoelectric layer, and a high acoustic velocity layer coupled to the piezoelectric layer at a first surface of the piezoelectric layer. The piezoelectric layer and the high acoustic velocity layer are coupled to each other via a conductive layer. The SAW device also includes at least one transducer coupled to a second surface of the piezoelectric layer, opposing the first surface of the piezoelectric layer. The at least one transducer includes a first multi-layer graphene layer coupled to a metal layer. The at least one transducer is configured to propagate a surface acoustic wave having an operating wavelength ($\lambda$) along the piezoelectric layer.

In any of the preceding aspects/embodiments, the conductive layer may be a second multi-layer graphene layer.

In any of the preceding aspects/embodiments, the second multi-layer graphene layer may include 3-10 atomic layers of graphene.

In any of the preceding aspects/embodiments, the first multi-layer graphene layer may include 3-10 atomic layers of graphene.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Within the 5G new radio frequency spectrum, 1-6 GHz offers a good mixture of coverage and capacity for 5G services, and the 3.3-3.8 GHz range provides a solid basis for initial commercial 5G services. Especially the 3.4-3.6 GHz range drives the economies of scale needed for low-cost devices. To obtain the wideband SAW filter at the 3.4-3.6 GHz range ($f_0$=3.5 GHz, $BW_{db}$=200 MHz and a relative bandwidth of 5.7%) for 5G service deployment, a piezoelectric structure with high electromechanical coupling coefficient $k^2$ (e.g., $k^2$>17%) is desired. Although some ScAlN/diamond multilayer structures may exhibit sufficient electromechanical coupling (e.g., having $k^2$>17%), the coupling coefficient of the structure typically decreases with an increase in the thickness of the metal electrode, resulting in lower electromechanical coupling in actual application. Although a ScAlN/diamond structure improves over traditional SAW filters in terms of device power handling capability due to the superior thermal conductivity of diamond layer, further improvement of device power handling capability is needed in SAW filters for RF front-end applications in the 5G New Radio base stations.

In various examples, the present disclosure describes SAW devices that maintain high electromechanical coupling coefficient and provide power durability. Examples of the disclosed SAW devices use multi-layer graphene layers to reduce stresses in the electrodes and to maintain thinness of the electrodes.

Figure 1:
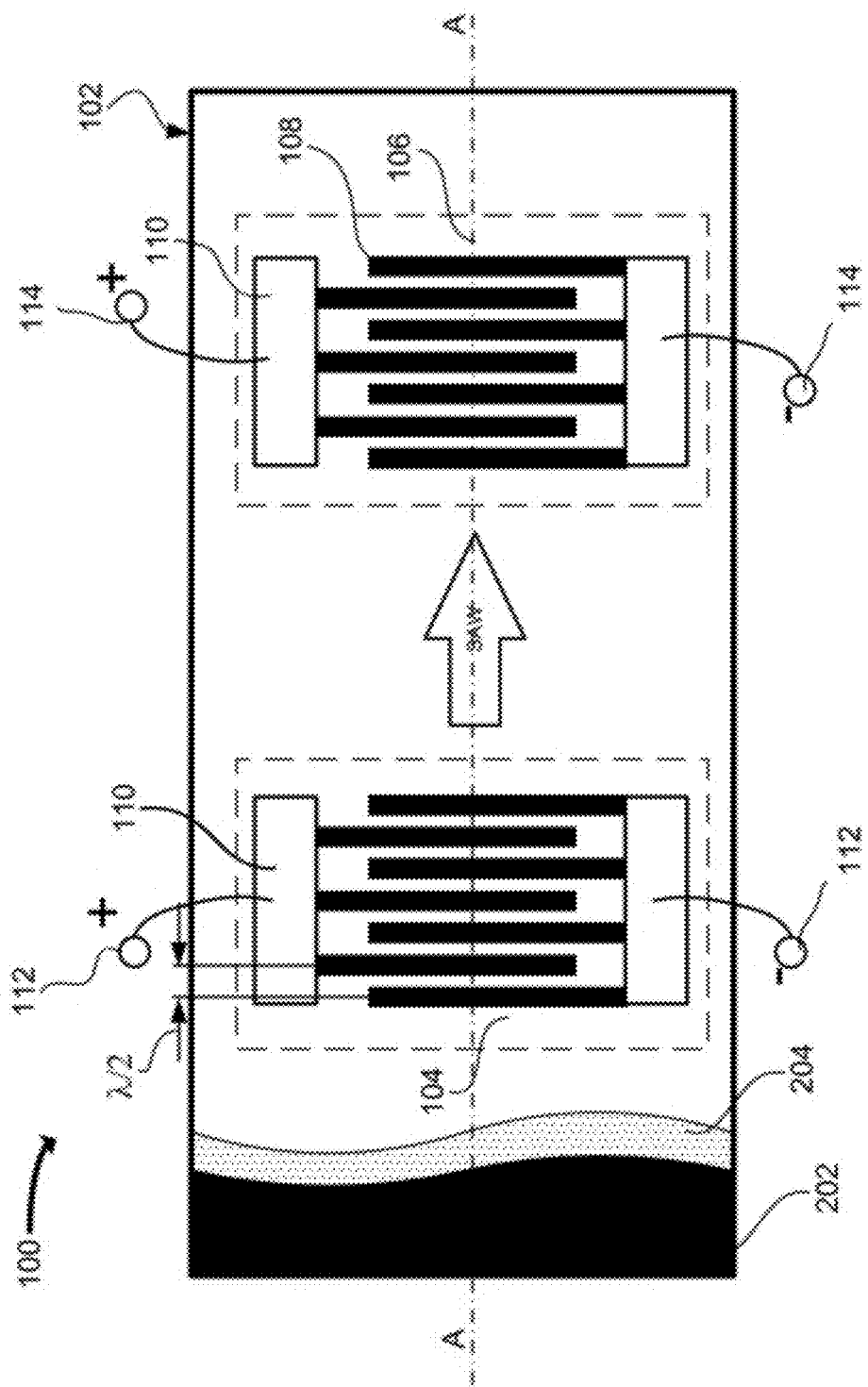
FIG. 1 is a top plan cut away view of an example SAW device having interdigital transducer (IDT) electrodes.

An example of a physical implementation of a surface acoustic wave (SAW) device 100, such as for example a wideband transversal filter, is shown in FIG. 1. The SAW device may be intended for use at the front-end of a radio-frequency (RF) transmitter/receiver able to handle high power, such as greater than 32 dBm. Although the description below makes reference to a particular SAW device 100, the techniques described herein may equally apply to other types of SAW filters and/or resonators. For example, any SAW transducer, interdigital transducer (IDT), Inter-digitated Inter-digital transducer (IIDT), ladder-type filter, or other such devices may incorporate the multi-layer structure(s) described herein.

The SAW device 100, which in this example embodiment only shows a basic filter for clarity and illustrative purposes, may include a multi-layered body 102 (as discussed further below) with an input transducer 104 and an output transducer 106, each indicated by their respective dashed box. In this example, an upper conductive layer 202 and a piezoelectric layer 204 of the body 102 have been partially cut away to show the transducers 104, 106. The input transducer 104 and the output transducer 106 may be coupled to the body 102. The input transducer 104 and the output transducer 106 each comprise a plurality of electrically conductive interdigital transducer (IDT) electrodes 108. The IDT electrodes 108 may be generally parallel to each other within their respective transducer 104/106 and each of the fingers of each IDT electrode 108 may be spaced by half of an operating wavelength ($\lambda$/2). The IDT electrodes 108 may be electrically coupled to lead-out bonding pad 110 for either supplying power to the IDT electrodes 108 by way of input terminals 112 (in the case of the input transducer 104) or receiving power by way of output terminals 114 from the IDT electrodes 108 (in the case of the output transducer 106). The IDT electrodes 108 may have an IDT thickness between approximately 0$\lambda$ and approximately 0.10$\lambda$, for example between about 0.01$\lambda$ and about 0.10$\lambda$, for example about 0.02$\lambda$ or about 0.08$\lambda$. In the present disclosure, a layer or material may be described as having a thickness of approximately 0$\lambda$ to indicate that the layer or material provides electric conduction but no mechanical mass-loading effect (e.g., for simulation purposes); a thickness of approximately 0$\lambda$ does not indicate that the layer or material is omitted. For example, in various cases a thickness of approximately 0$\lambda$ may be achieved using a material having a thickness on the order of tens of atoms, such as a multi-layer graphene material.

When power is supplied to input terminals 112, the input transducer 104 converts the electrical signal energy into a SAW (e.g. transduction) propagating along the body 102. The SAW may be carried across the body 102 and the SAW may be converted back into an electrical signal by the output transducer 106. The electrical signal may then be provided at the output terminals 114, for example to be received by a processor (not shown) via an analog-to-digital converter (not shown). The center frequency of a SAW filter may be given by the velocity of the SAW divided by the operating wavelength.

Figure 2:
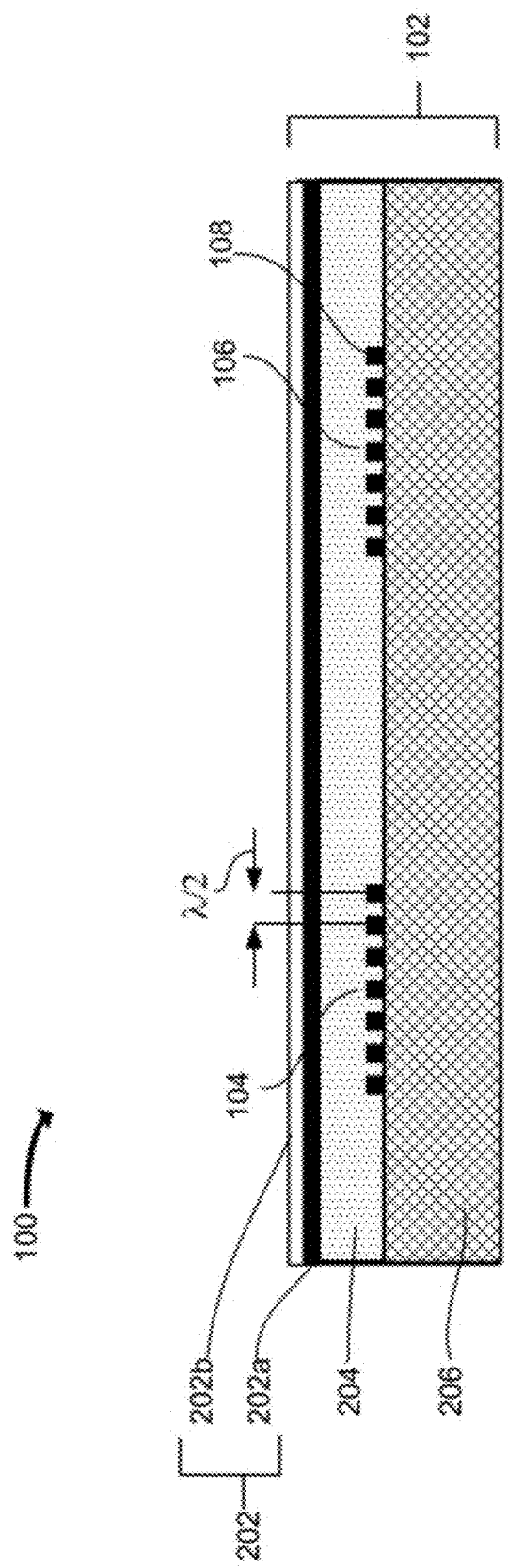
FIG. 2 is a side cross-section view of an example configuration of a SAW device.

FIG. 2 illustrates a side cross-sectional view, along line A-A in FIG. 1, of an example configuration of the SAW device 100. The dimensions of certain features have been exaggerated for illustration purposes. The body 102 of the SAW device 100 includes a high acoustic velocity layer 206 (e.g., a diamond layer), a piezoelectric layer 204 (e.g., a ScAlN film) and a conductive layer 202 (which may also be referred to as a short layer or a short surface). The input transducer 104 and the output transducer 106 each comprise electrodes 108. The transducers 104, 106 are positioned between the piezoelectric layer 204 and the high acoustic velocity layer 206, and configured to propagate a surface acoustic wave along the piezoelectric layer 204, at an operating frequency $f_0$.

In various examples described herein, the layers of the body 102 may be arranged in different orders. The electrodes 108 may be positioned between various pairs of the layers of the body 102, and may be embedded in different layers of the body 102. In this example the electrodes 108 may be embedded in the piezoelectric layer 204; in other examples, the electrodes 108 may be embedded in the high acoustic velocity layer 206.

The electrodes 108 in this example may be made of a multi-layer graphene layer, for example multi-layer graphene having 2-10 atomic layers, for example 3-5 atomic layers. Simulations have found that using such a multi-layer graphene layer for the electrodes 108 achieves the highest electromechanical coupling coefficient, in the configuration of FIG. 2. Generally, for a metal with thickness less than 50 nm, the thinner the material the greater the Ohmic loss, particularly at high operating frequency; this is not the case for graphene.

The conductive layer 202 in this example may be a metal layer 202a coupled to another multi-layer graphene layer 202b. The metal layer 202a may be copper (Cu), and the multi-layer graphene layer 202b may have 2-10 atomic layers, for example 3-5 atomic layers. In this example, the transducers 104, 106 are considered to be coupled to a first surface of the piezoelectric layer 204 and the conductive layer 202 is considered to be coupled to a second surface of the piezoelectric layer 204, opposing the first surface.

In an example implementation, the configuration shown in FIG. 2 may have an operating frequency of 2.1 GHz, and an operating wavelength of $\lambda=3.85$ µm. The thickness of the piezoelectric layer 204 (e.g., ScAlN layer) may be about $0.2\lambda$ (0.77 µm), and the thickness of the high acoustic velocity layer 206 (e.g., diamond layer) may be about 20 µm. In the conductive layer 202, the metal layer 202a (e.g., copper layer) may have a thickness of about $0.01\lambda$ (38.5 nm). The electrodes 108 made of the multi-layer graphene layer may have a thickness of essentially $0\lambda$. The multi-layer graphene layer 202b of the conductive layer 202 may also have a thickness of essentially $0\lambda$.

The use of a multi-layer graphene layer for the electrodes 108 may provide high effective electromechanical coupling coefficient even at very high operating frequency (e.g., up to 10 GHz), because the multi-layer graphene layer is highly conductive and has very small thickness.

Figure 3A:
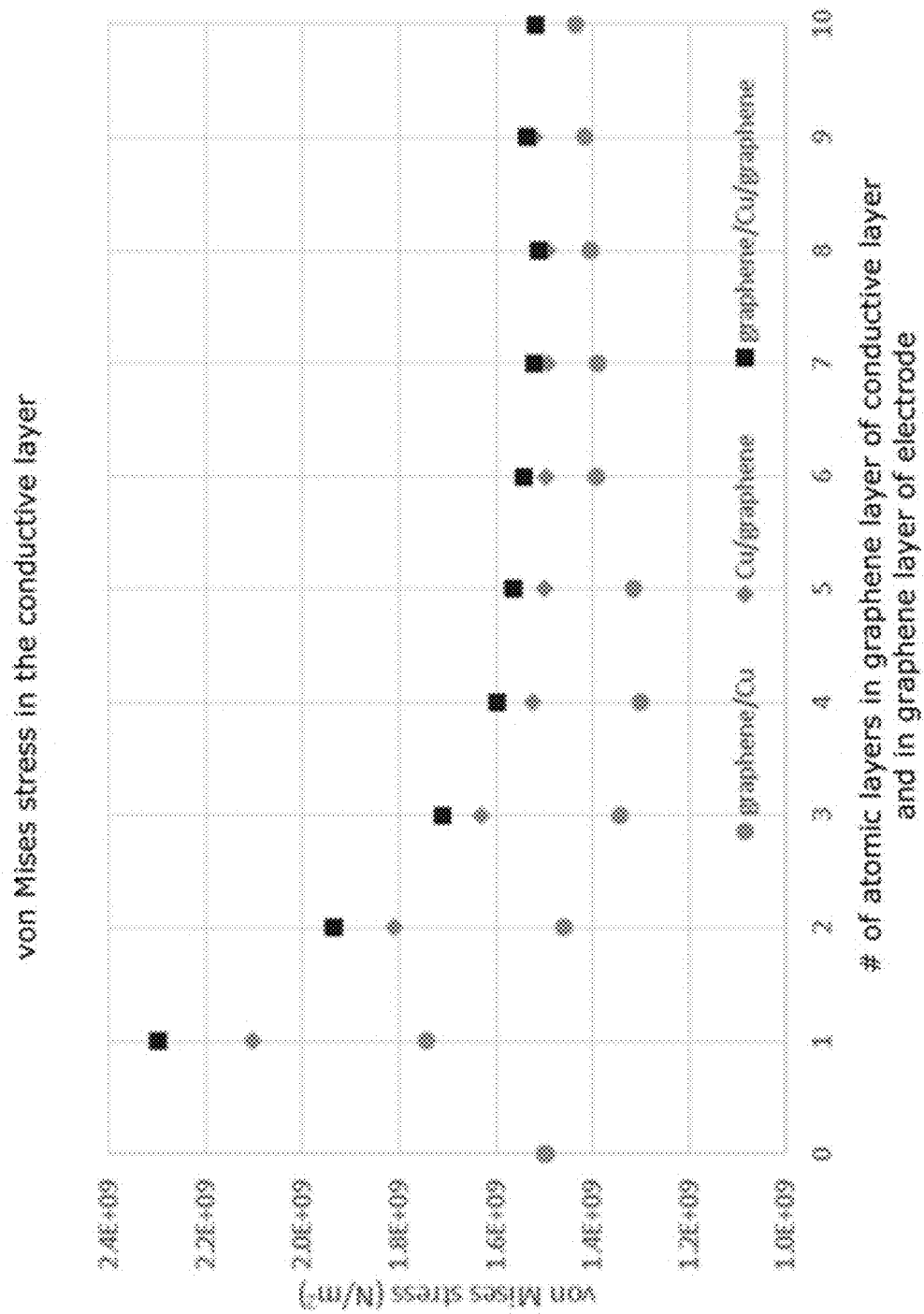
FIGS. 3A and 3B are charts showing simulation results of von Mises stress in the conductive layer for different layer configurations and in the electrodes, when the number of atomic layers in the graphene layers in both the conductive layer and the electrodes is varied together.
Figure 3B:
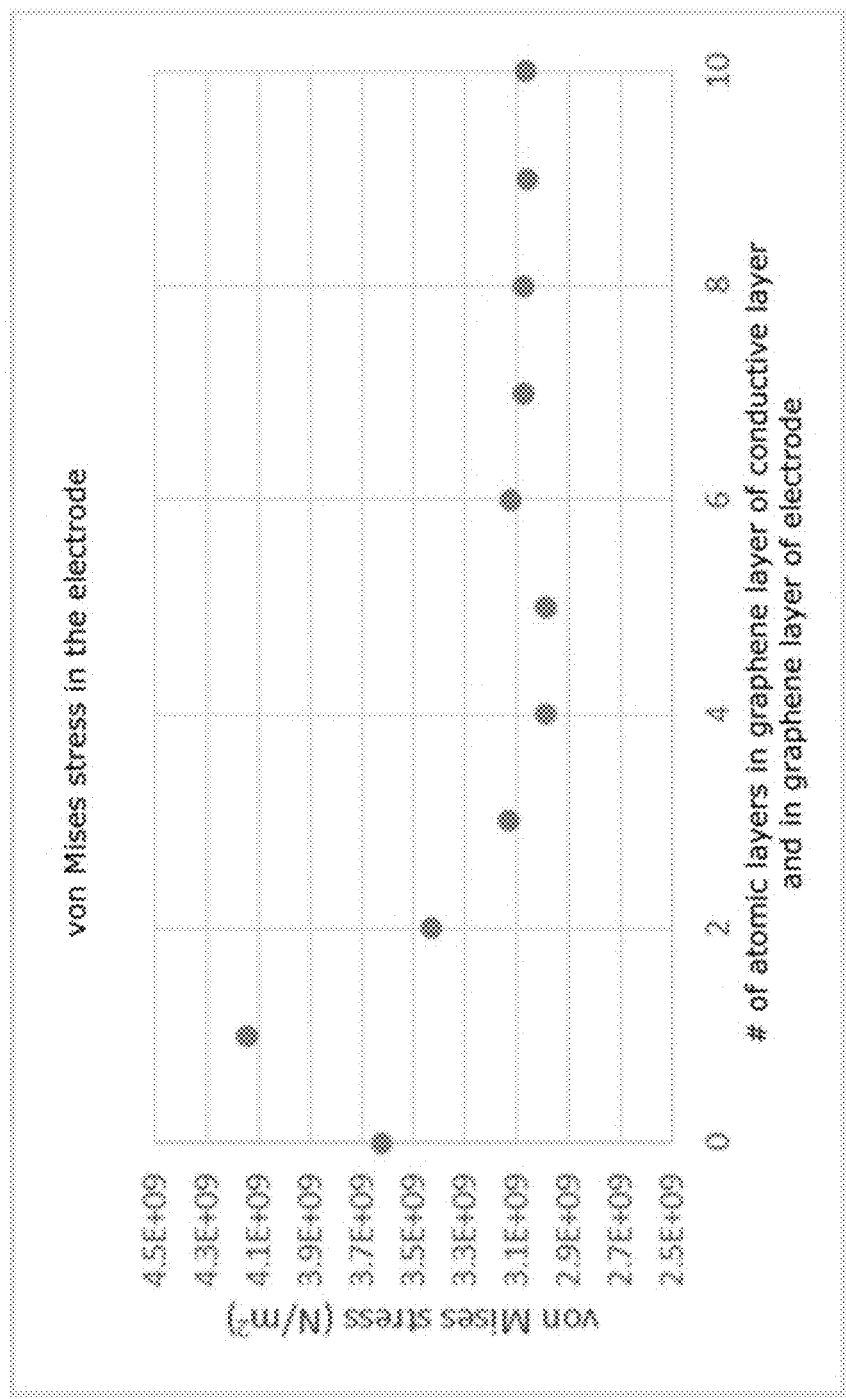

Using a combination of metal and multi-layer graphene for the conductive layer 202 may provide higher power durability and/or may help to achieve a desired high electromechanical coupling coefficient. The use of 2-10 atomic layers for the multi-layer graphene layer 202b has been found to impart high power durability to the SAW device 100, with better performance than when fewer atomic layers of graphene are used. FIG. 3A is a chart showing the von Mises stress in the conductive layer 202a when different numbers of atomic layers are used for the multi-layer graphene layer 202b in the conductive layer 202, and for the electrodes 108. FIG. 3B is a chart showing the von Mises stress in the electrodes 108 when different numbers of atomic layers are used for the multi-layer graphene layer 202b in the conductive layer 202, and for the electrodes 108. In FIGS. 3A and 3B, the thicknesses of the multi-layer graphene layer 202b and the electrodes 108 were varied together (i.e., x-axis values reflect the number of atomic layers of graphene in the graphene layer 202b and the same number of atomic layers of graphene in the electrodes 108). FIGS. 3A and 3B show results of simulations performed for the configuration shown in FIG. 2, based on the example dimensions provided above and varying the thicknesses of the multi-layer graphene layer 202b and of the electrodes 108. Further, FIG. 3A shows simulation results for different configurations of the conductive layer 202, specifically by coupling the graphene layer 202b on top of the metal layer 202a (graphene/Cu); by coupling the metal layer 202a on top of the graphene layer 202b (Cu/graphene); and by sandwiching the metal layer 202a between two graphene layers 202b (graphene/Cu/graphene).

As shown in FIG. 3A, reduction in von Mises stress, compared with the case where no graphene layer is present (i.e., # of graphene layers is 0), occurred only for the conductive layer configuration where the graphene layer 202b is coupled on top of the metal layer 202a (graphene/Cu), as illustrated in FIG. 2. Interestingly, simulations have found that the graphene/Cu/graphene conductive layer configuration exhibited the most degradation of electromechanical coupling coefficient with increasing thickness of graphene, among the three conductive layer configurations, and also exhibited the highest von Mises stress among the three conductive layer configurations.

Thus, the following discussion of FIGS. 3A and 3B will focus only on the graphene/Cu configuration for the conductive layer 202.

As shown in FIGS. 3A and 3B, using monolayer graphene for the graphene layer 202b and for the electrodes 108 was found to result in higher von Mises stress in the conductive layer 202 and the electrodes 108, and using 2-10 atomic layers for the graphene layer 202b and for the electrodes 108 was found to result in tower von Mises stress in the conductive layer 202 and the electrodes 108. Further, using 3-5 atomic layers for the graphene layer 202b and for the electrodes 108 was found to result in even lower von Mises stress in the conductive layer 202 and the electrodes 108. Thus, simply using the thinnest possible graphene (e.g., monolayer graphene) may not be desirable. FIGS. 3A and 3B also show that using the 2-10 atomic layer graphene layer 202b over the metal layer 202a resulted in lower von Mises stress in the conductive layer 202 and the electrodes 108, compared to when no graphene layer 202b is used (i.e., when the number of atomic layers of graphene is 0). At greater than 10 atomic layers, the multi-layer graphene begins to behave like graphite and loses the properties of graphene.

Simulations also found that the electromechanical coupling coefficient is expected to reach a maximum ($k^2 > 17.5\%$) when the example SAW device 100 of FIG. 2 is operating in the second mode (i.e., Sezawa mode) and when the metal layer 202a (e.g., a copper layer) has a thickness of about $0.01\lambda$.

Simulations have also found that, in the configuration shown in FIG. 2, the acoustic velocity increases (and hence results in higher SAW device operating frequency) when the electrode 108 thickness decreases, when the metal layer 202a thickness of the conductive layer 202 decreases, and when the number of atomic layers of the graphene layer 202b in the conductive layer 202 increases.

Balancing the various considerations discussed above, including factoring in trade-offs between higher acoustic velocity and higher electromechanical coupling coefficient, for example, it has been found that using an electrode 108 of essentially $0\lambda$ thickness (e.g., using 2-10 atomic layer or 3-5 atomic layer graphene for the electrode 108), using a metal layer 202a of $0.01\lambda$ (e.g., a copper layer having thickness of $0.01\lambda$) and using 2-10 atomic layer or 3-5 atomic layer graphene layer 202b over the metal layer 202a, achieved a SAW device 100 with the desired performance.

Figure 4:
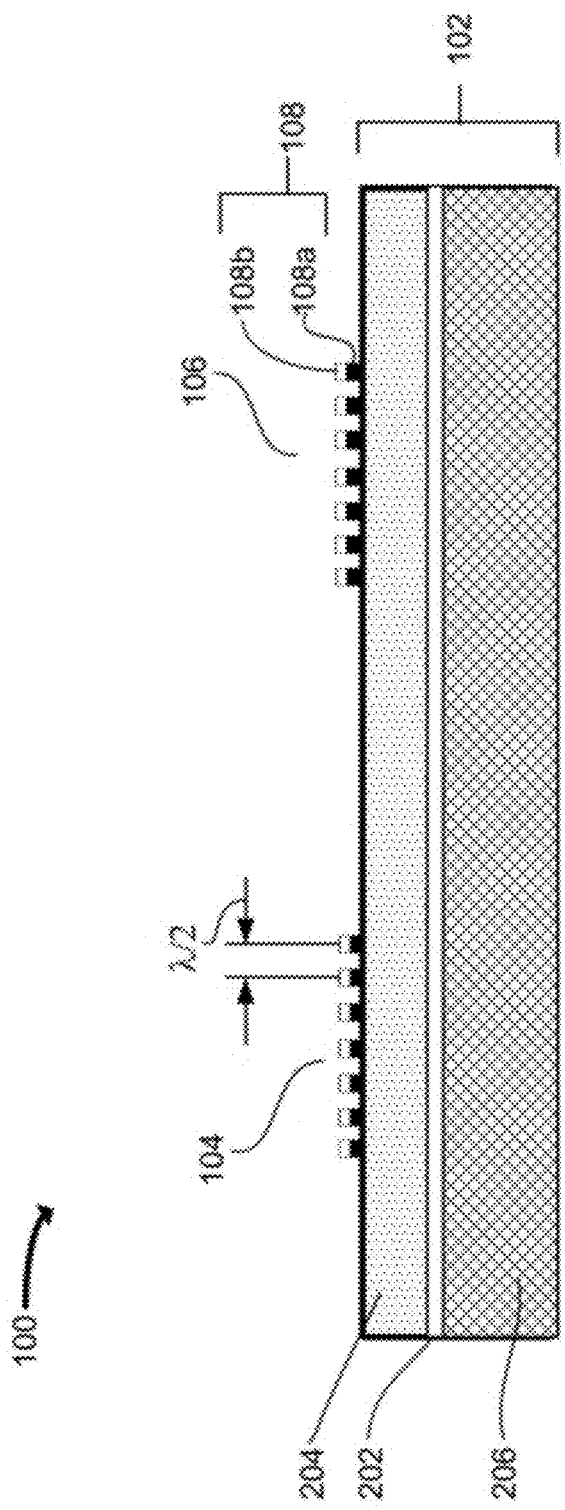
FIG. 4 is a side cross-section view of another example configuration of a SAW device.

FIG. 4 illustrates a side cross-sectional view of another example configuration of the SAW device 100. The dimensions of certain features have been exaggerated for illustration purposes. The body 102 of the SAW device 100 includes the high acoustic velocity layer 206 (e.g., a diamond layer), the piezoelectric layer 204 (e.g., a ScAlN film) and the conductive layer 202. Unlike the example configuration of FIG. 2, the configuration illustrated in the example of FIG. 4 positions the conductive layer 202 between the high acoustic velocity layer 206 and the piezoelectric layer 204, and positions the transducers 104, 106 on top of the piezoelectric layer 204. In this example, the conductive layer 202 is considered to be coupled to a first surface of the piezoelectric layer 204 and the transducers 104, 106 are considered to be coupled to a second surface of the piezoelectric layer 204, opposing the first surface.

In this example, the conductive layer 202 may be a multi-layer graphene, for example having 3-10 atomic layers. The electrodes 108 of the transducers 104, 106 in this example may include a metal layer 108a coupled to another multi-layer graphene layer 108b. The metal layer 108a may be copper (Cu), and the multi-layer graphene layer 108b may have 3-10 atomic layers.

In an example implementation, the configuration shown in FIG. 4 may have an operating frequency of 2.1 GHz, and an operating wavelength of $\lambda=2.63$ μm. The thickness of the piezoelectric layer 204 (e.g., ScAlN layer) may be about $0.8\lambda$ (2.11 μm), and the thickness of the high acoustic velocity layer 206 (e.g., diamond layer) may be about 10 μm. The conductive layer 202 (e.g., multi-layer graphene) may have a thickness of 3-10 atomic layers (thickness of essentially $0\lambda$). In the electrodes 108, the metal layer 108a (e.g., copper layer) may have a thickness of about $0.08\lambda$ (0.21 μm) and the multi-layer graphene layer 108b may have a thickness of 3-10 atomic layers (thickness of essentially $0\lambda$).

Figure 5A:
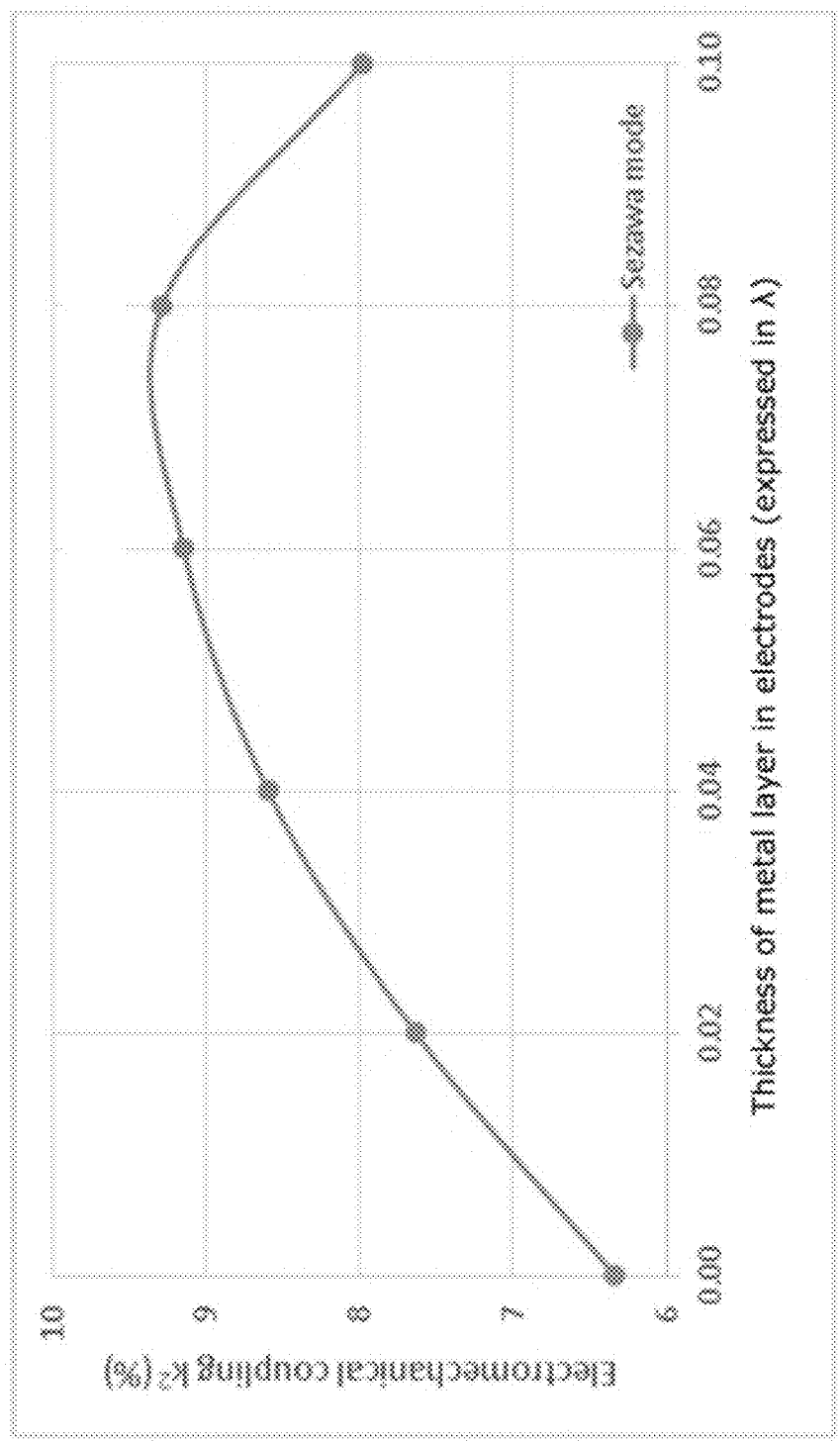
FIG. 5A is a chart showing simulation results of electromechanical coupling coefficient for varying thickness of the metal layer in the electrodes.
Figure 5B:
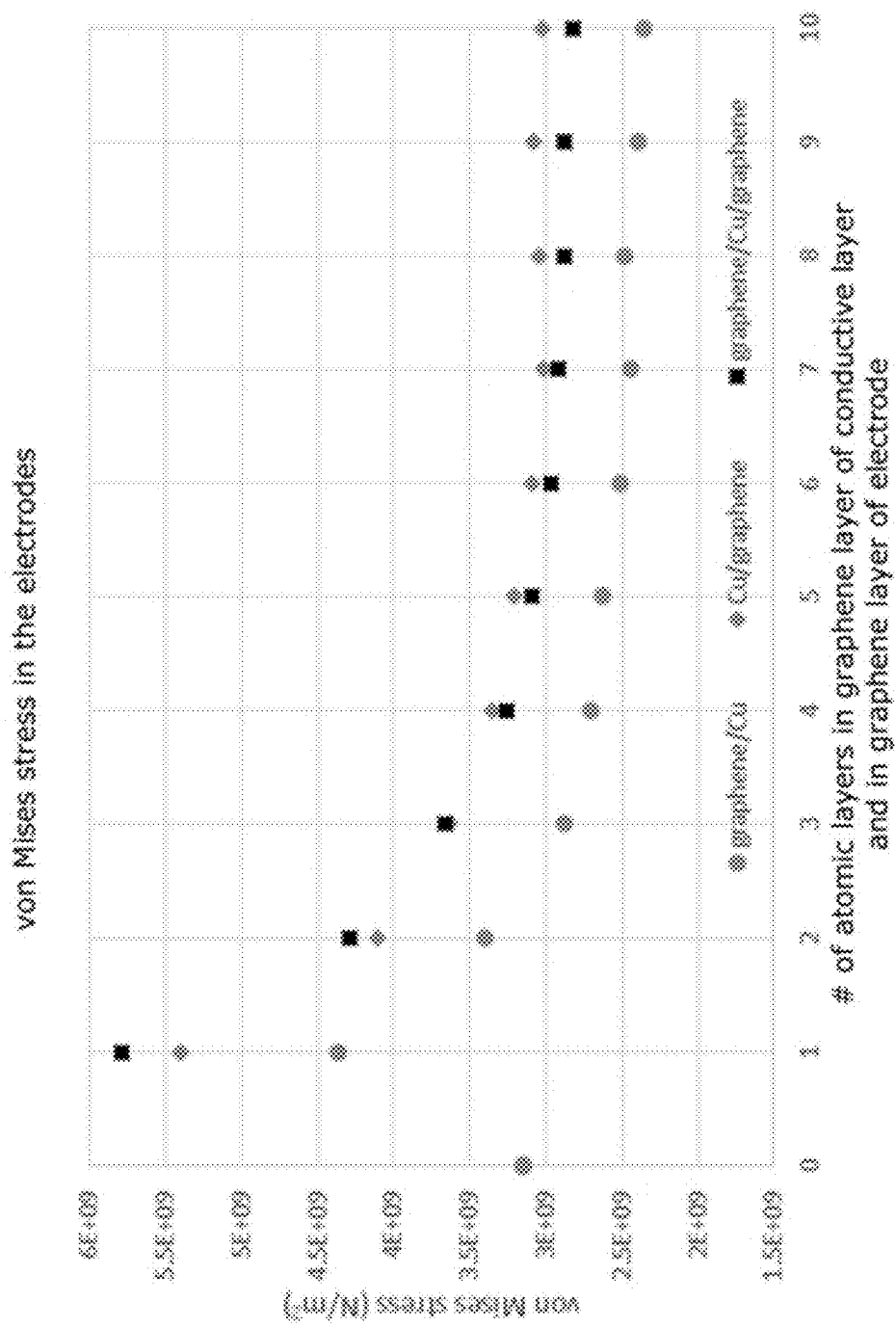
FIG. 5B is a chart showing simulation results of von Mises stress in the electrodes, for different electrode configurations, when the number of atomic layers in the graphene layers in both the conductive layer and the electrodes is varied together.

The configuration in the example of FIG. 4 may be suitable for wave propagation in the Sezawa mode. FIG. 5A shows simulation results, based on the example dimensions provided above and varying the thickness of the metal layer 108a of the electrodes 108. As illustrated in FIG. 5A, simulations have found that a maximum electromechanical coupling coefficient may be achieved when the thickness of the electrodes 108 is about $0.08\lambda$, rather than being as thin as possible. Therefore, unlike the example configuration of FIG. 2, using graphene alone for the electrodes 108 may not be desirable. FIG. 5B shows simulation results, based on the example dimensions provided above and varying the number of atomic layers in the multi-layer graphene layer 108b of the electrodes 108 and in the conductive layer 202, and for different arrangement of layers for the electrodes 108. Specifically, FIG. 5B compare the performance of electrodes 108 formed by coupling the graphene layer 108b on top of the metal layer 108a (graphene/Cu); by coupling the metal layer 108a on top of the graphene layer 108b (Cu/graphene); and by sandwiching the metal layer 108a between two graphene layers 108b (graphene/Cu/graphene). In FIG. 5B, the thicknesses of the multi-layer graphene layer 108b and the conductive layer 202 were varied together.

As shown in FIG. 5B, reduction in von Mises stress, compared with the case where no graphene layer is present (i.e., # of graphene layers is 0), occurred only for the electrode configuration where the graphene layer 108b is coupled on top of the metal layer 108a (graphene/Cu). This is the configuration illustrated in FIG. 4. Interestingly, the electrode configuration with the metal layer 108a sandwiched between two graphene layers 108b (graphene/Cu/graphene) exhibited the highest von Mises stress among the three electrode configurations.

As shown in FIG. 5B, regardless of the configuration of the electrodes 108, when the number of atomic layers of graphene is only one, the von Mises stress in the electrodes 108 was found to be highest. Thus, simply using the thinnest possible graphene in the electrodes 108 and in the conductive layer 202 may not be desirable. Using 3-10 atomic layers for the graphene layer 108b and for the conductive layer 202 was found to result in lower von Mises stress in the electrodes 108 than when no graphene layer 108b was used (i.e., when the number of atomic layers of graphene is 0), thus enhancing the high power durability of the electrodes 108.

These simulation results indicate that the selection of an appropriate number of atomic layers for the graphene layer 108b and how the graphene layer 108b is coupled to the metal layer 108a to form the electrode 108 are non-trivial considerations when designing the example SAW device 100 of FIG. 4.

Simulations also found that using 3-10 atomic layer graphene for the multi-layer graphene layer 108b and for the conductive layer 202 between the piezoelectric layer 204 and the high velocity acoustic layer 206 supported achievement of the maximum electromechanical coupling coefficient.

Figure 6:
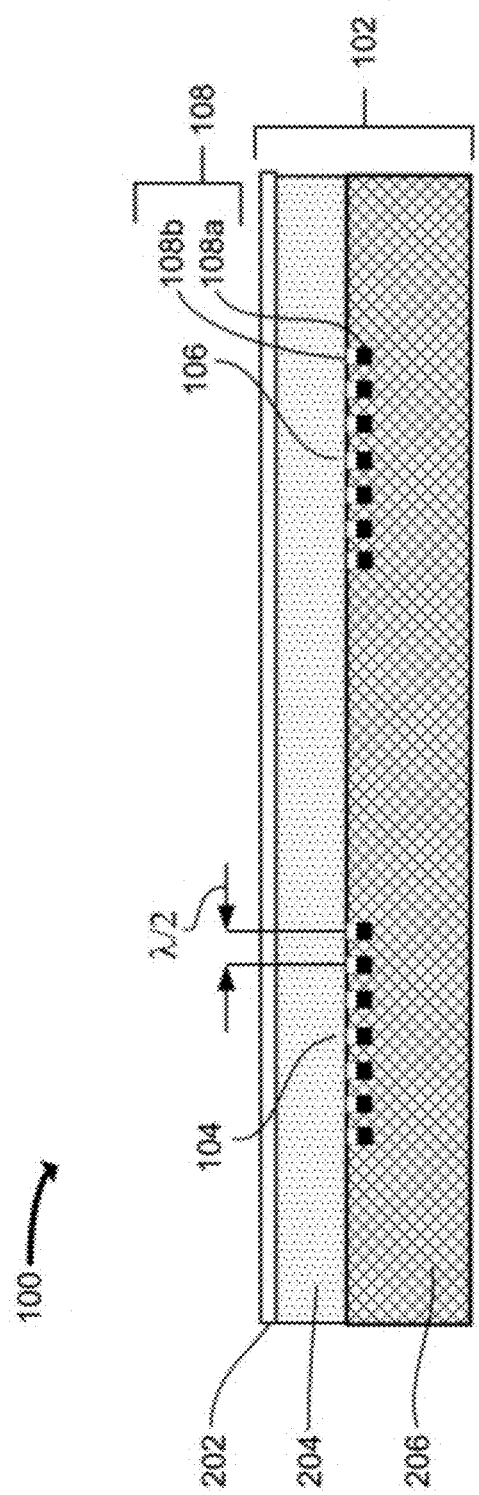
FIG. 6 is a side cross-section view of another example configuration of a SAW device.

FIG. 6 illustrates a side cross-sectional view of another example configuration of the SAW device 100. The dimensions of certain features have been exaggerated for illustration purposes. The body 102 of the SAW device 100 includes the high acoustic velocity layer 206 (e.g., a diamond layer), the piezoelectric layer 204 (e.g., a ScAlN film) and the conductive layer 202. In this example, the electrodes 108 are positioned between the piezoelectric layer 204 and the high acoustic velocity layer 206, with the conductive layer 202 coupled to the piezoelectric layer 204, similar to the configuration of FIG. 2. Unlike the example shown in FIG. 2, the transducers 104, 106 in the example of FIG. 6 are embedded in the high acoustic velocity layer 206, the electrodes 108 of the transducers 104, 106 include a metal layer 108a (e.g., copper) coupled to a multi-layer graphene layer 108b (for example having 3-10 atomic layers, similar to the electrodes 108 in the example of FIG. 4), and the conductive layer 202 includes only the multi-layer graphene, for example having 3-10 atomic layers.

In this example, the transducers 104, 106 are considered to be coupled to a first surface of the piezoelectric layer 204 and the conductive layer 202 is considered to be coupled to a second surface of the piezoelectric layer 204, opposing the first surface.

In an example implementation, the configuration shown in FIG. 6 may have an operating frequency of 2.1 GHz, and an operating wavelength of $\lambda=3.76$ μm. The thickness of the piezoelectric layer 204 (e.g., ScAlN layer) may be about $0.2\lambda$ (0.77 μm), and the thickness of the high acoustic velocity layer 206 (e.g., diamond layer) may be about 10 μm. In the conductive layer 202 (e.g., multi-layer graphene) may have a thickness of 3-10 atomic layers (thickness of essentially $0\lambda$). In the electrodes 108, the metal layer 108a (e.g., copper layer) may have a thickness of about $0.01\lambda$ (38.5 nm) and the multi-layer graphene layer 108b may have a thickness of 3-10 atomic layers (thickness of essentially $0\lambda$).

Figure 7A:
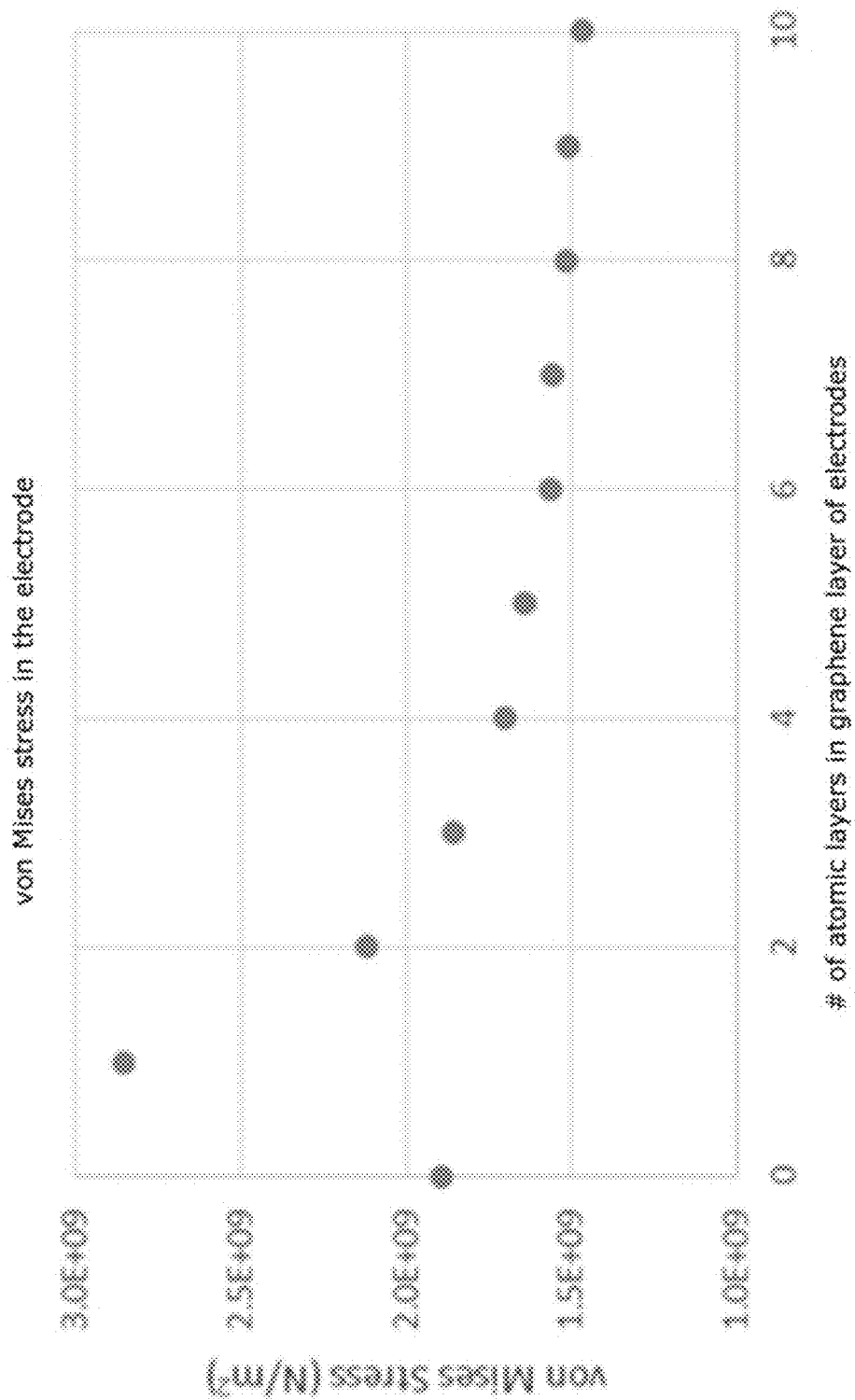
FIG. 7A is a chart showing simulation results of von Mises stress in the electrodes, for varying numbers of atomic layers in the graphene layer in the electrodes.

FIG. 7A shows simulation results, based on the example dimensions provided above and varying the number of atomic layers in the multi-layer graphene layer 108b of the electrodes 108 and in the conductive layer 202. In FIG. 7A, the thicknesses of the multi-layer graphene layer 108b and the conductive layer 202 were varied together. As shown in FIG. 7A, using single-layer or bilayer graphene for the graphene layer 108b and the conductive layer 202 was found to result in higher von Mises stress in the electrodes 108. Thus, simply using the thinnest possible graphene layer 108b (e.g., monolayer graphene) may not be desirable. Using 3-10 atomic layers for the graphene layer 108b and conductive layer 202 was found to result in lower von Mises stress in the electrodes 108 than when no graphene layer 108b was used (i.e., when the number of atomic layers of graphene is 0), thus enhancing the high power durability of the electrodes 108.

Figure 7B:
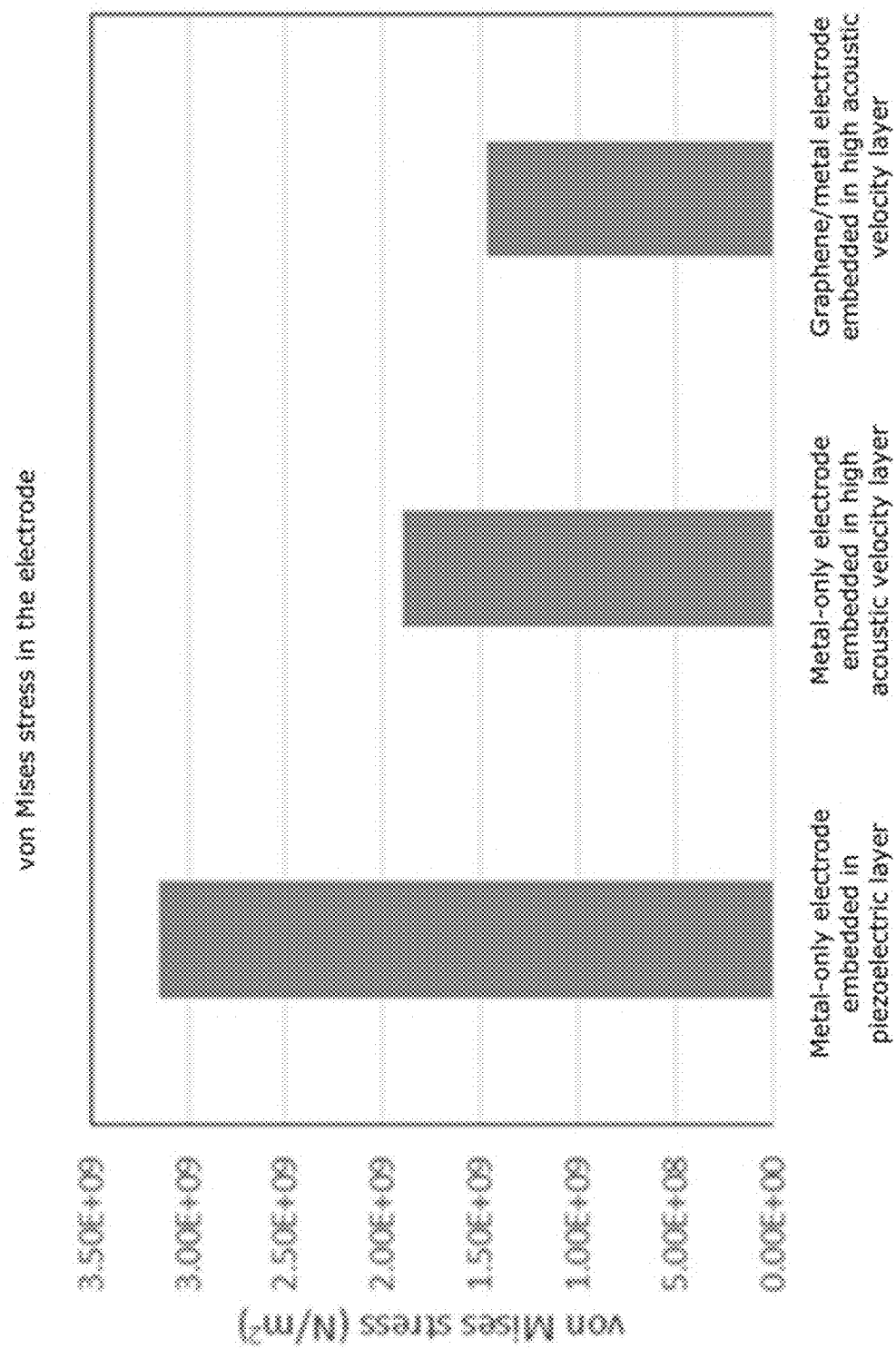
FIG. 7B is a chart showing simulation results of von Mises stress in the electrodes, for different positioning of the electrodes and different electrode configurations.

FIG. 7B shows simulation results comparing the von Mises stress in the electrodes 108 for different positioning of the electrodes 108. As shown in FIG. 7B, when the electrodes 108 have only the metal layer 108a and are embedded in the piezoelectric layer 204, the von Mises stress in the electrodes 108 is higher than when the metal-only electrodes 108 are embedded in the high acoustic velocity layer 206. Further, FIG. 7B shows that even lower von Mises stress in the electrodes 108 can be achieved by coupling a multi-layer graphene layer 108b to the metal layer 108a to form the electrodes 108. These results illustrate some possible benefits of coupling the multi-layer graphene layer 108b to the metal layer 108a in the electrodes 108, namely reduced von Mises stress in the electrodes 108 (hence longer time-to-failure). This may be because the multi-layer graphene layer 108b acts as a metal diffusion barrier, reducing acoustomigration (e.g., due to voids and hillocks in the metal layer 108a) and hence reducing stress in the electrodes 108 and enhancing the power durability of the SAW device 100. Embedding the electrodes 108 in the high acoustic velocity layer 206 with high thermal conductivity may also be beneficial by providing a good thermal path for heat escape from the electrodes 108, which also may hence power durability of the SAW device 100. Although not shown in FIG. 7B, the von Mises stress in the electrodes 108 may also be suitably low where the electrodes 108 include the multi-layer graphene layer 108b coupled to the metal layer 108a, and the electrodes 108a are embedded in the piezoelectric layer 204.

Simulations also found that the phase velocity of the SAW device 100 increases with increasing number of atomic layers in the multi-layer graphene layer 108b of the electrodes 108, and that the electromechanical coupling coefficient increases with decreasing number of atomic layers in the multi-layer graphene layer 108b of the electrodes 108. Thus, selection of the appropriate number of atomic layers for the multi-layer graphene layer 108b, and placement of the electrodes 108, involves a consideration of various trade-offs and is not a trivial or straightforward matter.

Figure 8:
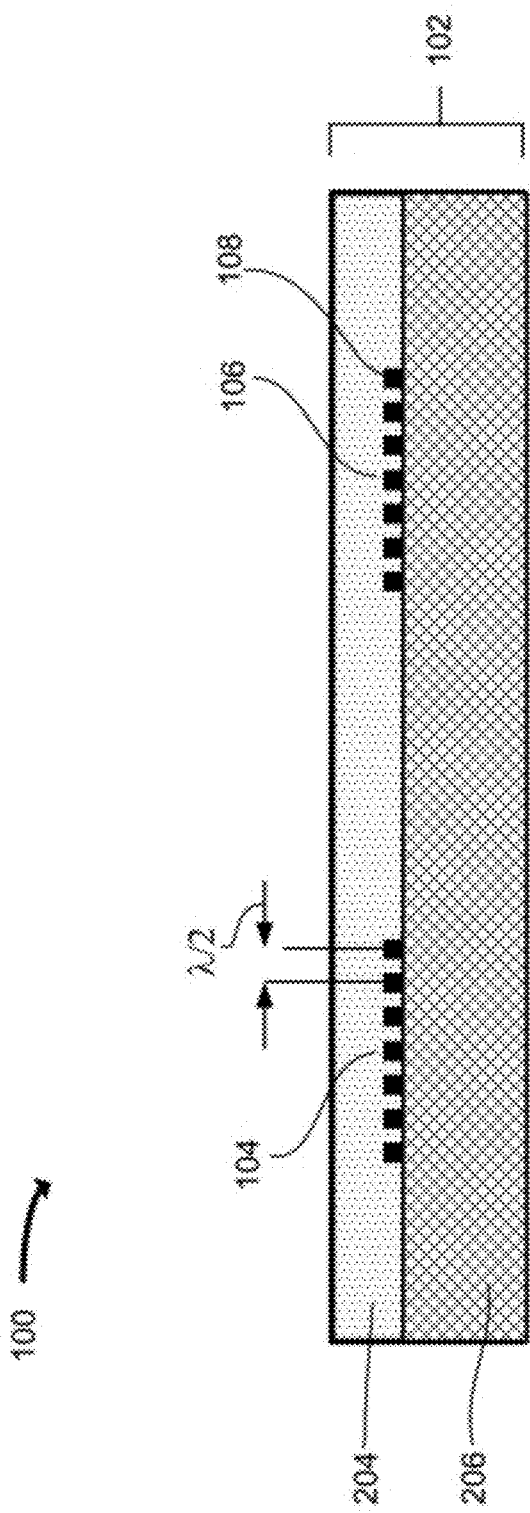
FIG. 8 is a side cross-section view of another example configuration of a SAW device.

FIG. 8 illustrates a side cross-sectional view of another example configuration of the SAW device 100. The dimensions of certain features have been exaggerated for illustration purposes. The body 102 of the SAW device 100 includes a high acoustic velocity layer 206 (e.g., a diamond layer) and a piezoelectric layer 204 (e.g., a ScAlN film). The electrodes 108 of the transducers 104, 106 are positioned between the piezoelectric layer 204 and the high acoustic velocity layer 206. The configuration of FIG. 8 is similar to the example configuration of FIG. 2; however, the conductive layer 202 is omitted. This configuration may be suitable for wave propagation in the Rayleigh mode. In this example the transducers 104, 106 may be embedded in the piezoelectric layer 204. The electrodes 108 in this example may be made of a multi-layer graphene layer, for example multi-layer graphene having 3-10 atomic layers.

In an example implementation, the configuration shown in FIG. 8 may have an operating frequency of 10 GHz, and an operating wavelength of $\lambda=0.46$ µm. The thickness of the piezoelectric layer 204 (e.g., ScAlN layer) may be about $0.45\lambda$ (0.21 µm), and the thickness of the high acoustic velocity layer 206 (e.g., diamond layer) may be about 5 µm. The electrodes 108 may have 3-10 atomic layers of graphene (thickness of essentially $0\lambda$).

Simulations have found that using the highly electrically conductive multi-layer graphene as electrodes 108 resulted in high effective electromechanical coupling coefficient and high acoustic velocity in the SAW device 100. Compared with other SAW devices having similar layer arrangement but using metal instead of graphene for the electrodes 108, the example configuration of FIG. 8 may enable higher operating frequency (e.g., 10 GHz) and at the same time keep Ohmic losses low (and hence maintaining a high electromechanical coupling coefficient) by keeping the thickness of the electrodes 108 low.

As noted above, the example configuration of FIG. 8 may be suitable for Rayleigh mode wave propagation, whereas the example configurations of FIGS. 2, 4 and 6 may be suitable for Sezawa mode wave propagation. Thus, different configurations of the SAW device 100 may be selected depending on the desired application.

Figure 9:
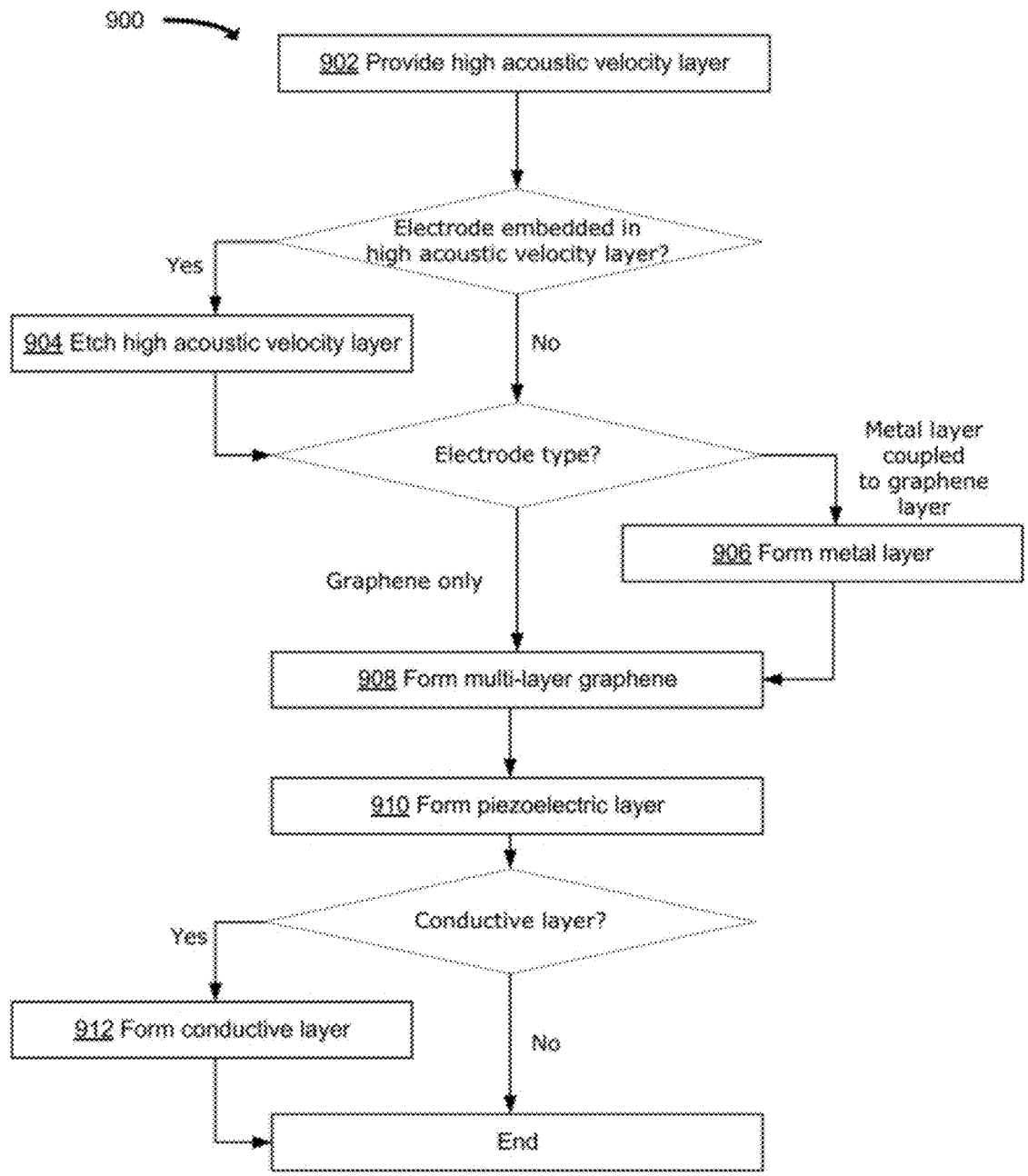
FIGS. 9 and 10 are flowcharts illustrating example methods of fabrication for various SAW devices disclosed herein.
Figure 10:
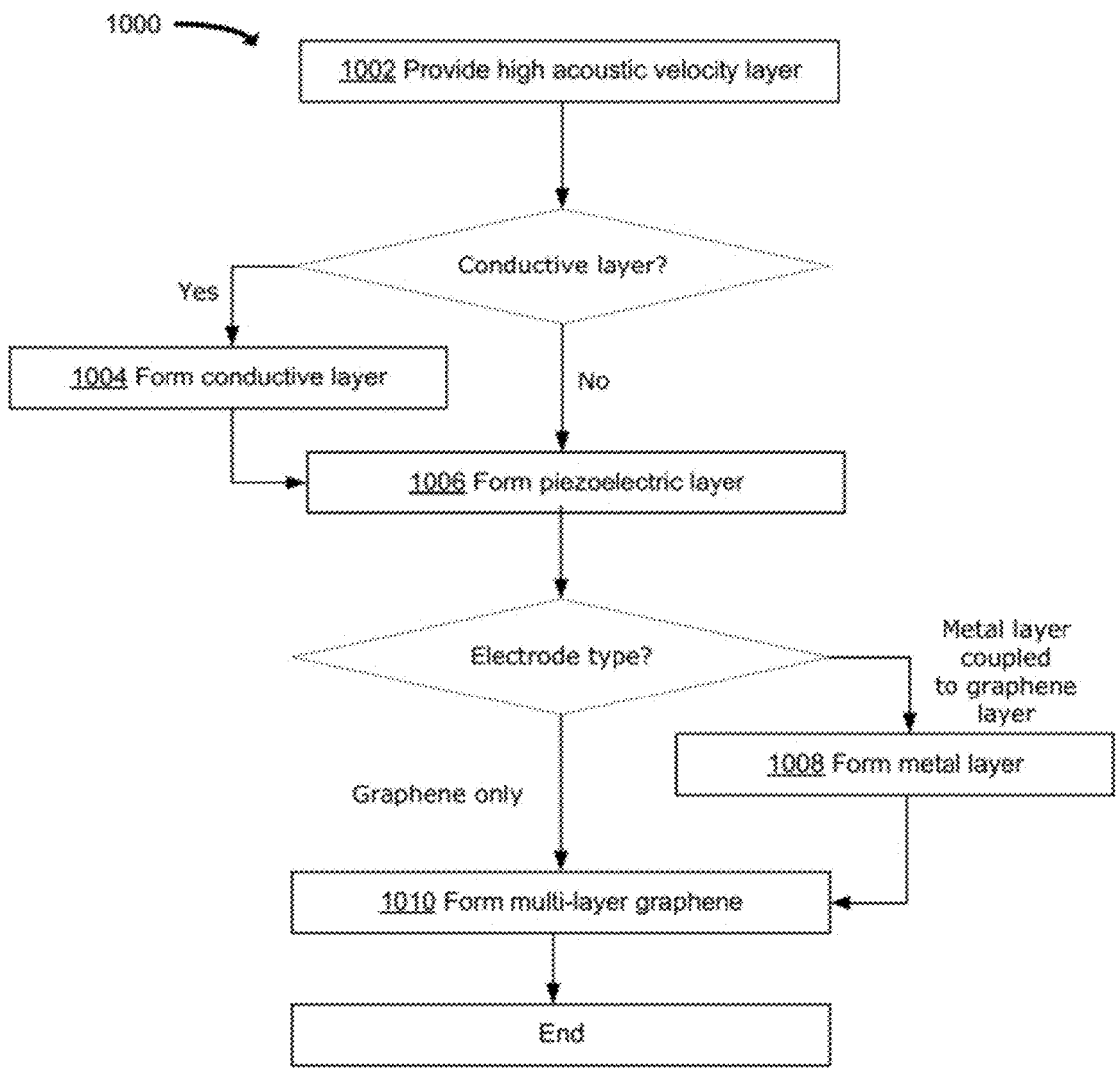

The example SAW devices 100 disclosed herein may be fabricated using any suitable fabrication techniques. FIGS. 9 and 10 are flowcharts illustrating example fabrication methods 900, 1000 that may be used.

The example method 900 illustrated in FIG. 9 may be used for fabricating the example SAW devices 100 of FIGS. 2, 6 and 8, for example, depending on which steps are performed and which are omitted.

At 902, the high acoustic velocity layer 206 is provided. For example, a diamond layer may be provided with suitable thickness (typically several times thicker than $\lambda$) using chemical vapor deposition (or other suitable technique). The diamond layer may also be polished and cleaned.

If the electrodes 108 are to be embedded in the high acoustic velocity layer 206 (e.g., in the example of FIG. 6), then at 904 the high acoustic velocity layer 206 is etched with a mask for patterning the electrodes 108. Otherwise, 904 is omitted.

If the electrodes 108 include a metal layer 108a coupled to a multi-layer graphene layer 108b (e.g., in the example of FIG. 6), then at 906 the metal layer is formed to the desired thickness, for example using metal deposition techniques. If 904 was omitted, the metal layer 108a may be patterned with a mask.

At 908, the multi-layer graphene is formed, either coupled to the metal layer 108a (e.g., in the example of FIG. 6) or directly on the high acoustic velocity layer 206 (e.g., in the examples of FIGS. 2 and 8). This may be by epitaxial graphene growth to the desired number of atomic layers over the high acoustic velocity layer 206, followed by patterning (e.g., using electron-beam nano-etching).

At 910, the piezoelectric layer 204 is formed. For example, this may be by sputtering or chemical vapor deposition of ScAlN to the desired thickness.

If a conductive layer 202 is required (e.g., in the examples of FIGS. 2 and 6), then at 912 the conductive layer 202 is formed by growth of the multi-layer graphene layer (e.g., in the example of FIG. 6) or by deposition of the metal layer 202a followed by growth of the multi-layer graphene layer 202b (e.g., in the example of FIG. 2).

Thus, the example of FIG. 2 may be obtained using the fabrication steps 902, 908, 910 and 912; the example of FIG. 6 may be obtained using the fabrication steps 902, 904, 906, 908, 910 and 912; and the example of FIG. 8 may be obtained using the fabrication steps 902, 908 and 910.

The example of FIG. 4 may be obtained using the example method 1000 illustrated in FIG. 10.

At 1002, the high acoustic velocity layer 206 is provided. For example, a diamond layer may be provided with suitable thickness (typically several times thicker than $\lambda$) using chemical vapor deposition (or other suitable technique). The diamond layer may also be polished and cleaned.

If a conductive layer 202 is required (e.g., in the example of FIG. 4), then at 1004 the conductive layer 202 is formed by growth of the multi-layer graphene layer (e.g., in the example of FIG. 4). The conductive layer 202 may also be formed by deposition of a metal layer, with or without growth of a multi-layer graphene layer on top.

At 1006, the piezoelectric layer 204 is formed. For example, this may be by sputtering or chemical vapor deposition of ScAlN to the desired thickness.

If the electrodes 108 include a metal layer 108a coupled to a multi-layer graphene layer 108b (e.g., in the example of FIG. 4), then at 1008 the metal layer is formed to the desired thickness, for example using metal deposition techniques. In some examples, where the electrodes 108 are embedded in the piezoelectric layer 204, formation of the electrodes 108 may be preceded by etching of the piezoelectric layer 204.

At 1010, the multi-layer graphene layer 108b of the electrodes 108 is formed. This may be by epitaxial graphene growth to the desired number of atomic layers over the metal layer 108a formed at 1008, followed by patterning (e.g., using electron-beam nano-etching).

Thus, the example of FIG. 4 may be obtained using the fabrication steps 1002, 1004, 1006, 1008 and 1010.

In various examples, the metal layer used in the graphene/metal electrodes or the graphene/metal conductive layer has been described as being copper (Cu). Other metals may also be suitable, such as aluminum (Al), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

In various examples, the piezoelectric layer has been described as being a ScAlN layer. Other materials may also be used for the piezoelectric layer, such as aluminum nitride (AlN), zinc oxide (ZnO) and other piezoelectric materials.

In various examples, the high acoustic velocity layer has been described as being a diamond layer. Other materials may also be used for the high acoustic velocity layer, such as silicon carbide (SiC), or other substrate materials.

Different configurations of the SAW device has been disclosed herein. A particular configuration may be selected for use depending on the specific application. For example, for a lower operating frequency, the electrodes may be designed as metal layer coupled with multi-layer graphene layer, whereas the electrodes may be designed as only graphene for a higher operating frequency. However, if the SAW device is intended only for generating waves and not reflecting acoustic waves, then the electrodes may be designed as only graphene even for lower operating frequencies.

In various examples disclosed herein, a SAW device is provided that may achieve a high effective electromechanical coupling coefficient ($k^2>17.5\%$) and high operating frequency (2.1 GHz or higher), at the same time providing high power durability, through the use of multi-layer graphene as the electrode and/or as the conductive layer. The use of a multi-layer graphene layer, with selected number of atomic layers (e.g., 3-10 atomic layers) may solve performance degradation issues of prior SAW devices while achieving the desired high effective electromechanical coupling coefficient and high operating frequency.

Achieving a high electromechanical coupling coefficient enables realization of wide-band SAW filters, such as a filter for E-UTRA band 42 with relative bandwidth of 5.7%. As well, a SAW filter with high electromechanical coupling coefficient may also be used to replace film bulk acoustic resonator (FBAR) filters at terminals, which may lead to cost savings because SAW filters tend to be lower cost than FBAR fitters.

Achieving high phase velocity in a SAW device may also enable realization of high frequency (e.g., 10 GHz) SAW filters.

The disclosed SAW devices may be useful for implementation as SAW filters in mobile terminals, base station and other infrastructure equipment.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of IDT electrodes 108 are disclosed herein, other sizes and shapes may be used. In another example, although a particular SAW device 100 (e.g. filter) may be described herein, the structures described may be adapted to other SAW device configurations.

The thicknesses of each of the layers described herein are meant to be illustrative and not restrictive. The figures may exaggerate or minimize the height of these layers for illustrative purposes and/or for ease of reference.

Although the example embodiments may be described with reference to a particular orientation (e.g. top and base), this was simply used as a matter of convenience and ease of reference in describing the figures.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave (SAW) device comprising:
a piezoelectric layer;
a high acoustic velocity layer coupled to the piezoelectric layer at a first surface of the piezoelectric layer; and
at least one transducer between the piezoelectric layer and the high acoustic velocity layer, the at least one transducer including a first multi-layer graphene layer, the first multi-layer graphene layer having 10 or fewer atomic layers of graphene, the at least one transducer being configured to propagate a surface acoustic wave having an operating wavelength ($\lambda$) along the piezoelectric layer.

2. The SAW device of claim 1, wherein the first multi-layer graphene layer comprises 2-10 atomic layers of graphene.

3. The SAW device of claim 2, wherein the first multi-layer graphene layer comprises 3-5 atomic layers of graphene.

4. The SAW device of claim 1, further comprising:
a conductive layer coupled to a second surface of the piezoelectric layer, opposing the first surface of the piezoelectric layer.

5. The SAW device of claim 4, wherein the conductive layer is a second multi-layer graphene layer coupled to a metal layer, the second multi-layer graphene layer having 10 or fewer atomic layers of graphene.

6. The SAW device of claim 5, wherein the second multi-layer graphene layer is 3-10 atomic layers of graphene.

7. The SAW device of claim 4, wherein the conductive layer is a second multi-layer graphene layer, the second multi-layer graphene layer having 10 or fewer atomic layers of graphene.

8. The SAW device of claim 7, wherein the second multi-layer graphene layer is 3-10 atomic layers of graphene.

9. The SAW device of claim 4, wherein the at least one transducer comprises an input transducer and an output transducer, and wherein the conductive layer overlaps both the input transducer and the output transducer, and the conductive layer extends between the input transducer and the output transducer.

10. The SAW device of claim 1, wherein the transducer comprises the first multi-layer graphene layer coupled to a metal layer.

11. The SAW device of claim 10, wherein the first multi-layer graphene layer is 3-10 atomic layers of graphene.

12. The SAW device of claim 10, wherein each electrode of the transducer is formed by the first multi-layer graphene layer coupled to a single metal layer.

13. The SAW device of claim 1, wherein the at least one transducer is embedded in the piezoelectric layer.

14. The SAW device of claim 1, wherein the at least one transducer is embedded in the high acoustic velocity layer.

15. A surface acoustic wave (SAW) device comprising:
a piezoelectric layer;
a high acoustic velocity layer coupled to the piezoelectric layer at a first surface of the piezoelectric layer;
the piezoelectric layer and the high acoustic velocity layer being coupled to each other via a conductive layer; and
at least one transducer coupled to a second surface of the piezoelectric layer, opposing the first surface of the piezoelectric layer, the at least one transducer including a first multi-layer graphene layer coupled to a metal layer, the first multi-layer graphene layer having 10 or fewer atomic layers of graphene, the at least one transducer being configured to propagate a surface acoustic wave having an operating wavelength ($\lambda$) along the piezoelectric layer.

16. The SAW device of claim 15, wherein the conductive layer is a second multi-layer graphene layer, the second multi-layer graphene layer having 10 or fewer atomic layers of graphene.

17. The SAW device of claim 16, wherein the second multi-layer graphene layer comprises 3-10 atomic layers of graphene.

18. The SAW device of claim 15, wherein the first multi-layer graphene layer comprises 3-10 atomic layers of graphene.

* * * * *